US010951234B2

(12) United States Patent
Sridhara et al.

(10) Patent No.: US 10,951,234 B2
(45) Date of Patent: *Mar. 16, 2021

(54) NON-LINEAR LLR LOOK-UP TABLES

(71) Applicant: Seagate Technology LLC, Cupertino, CA (US)

(72) Inventors: Deepak Sridhara, Longmont, CO (US); Rishi Ahuja, Broomfield, CO (US); William M. Radich, Berthoud, CO (US); Ara Patapoutian, Hopkinton, MA (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/245,080

(22) Filed: Jan. 10, 2019

(65) Prior Publication Data

US 2020/0212934 A1 Jul. 2, 2020

Related U.S. Application Data

(63) Continuation of application No. 16/233,555, filed on Dec. 27, 2018, now Pat. No. 10,804,932.

(51) Int. Cl.
*H03M 13/11* (2006.01)
*H03M 13/39* (2006.01)
*H03M 13/45* (2006.01)

(52) U.S. Cl.
CPC .... *H03M 13/1125* (2013.01); *H03M 13/1114* (2013.01); *H03M 13/1128* (2013.01); *H03M 13/3927* (2013.01); *H03M 13/45* (2013.01)

(58) Field of Classification Search
CPC ............ H03M 13/45; H03M 13/1114; H03M 13/1128; H03M 13/1125; H03M 13/3927
See application file for complete search history.

(56) References Cited

U.S. PATENT DOCUMENTS

| | | | | |
|---|---|---|---|---|
| 5,632,003 | A * | 5/1997 | Davidson | H04B 1/665 704/200.1 |
| 8,280,987 | B2 | 10/2012 | McGowan et al. | |
| 9,049,093 | B2 | 6/2015 | Fein et al. | |
| 2002/0159367 | A1 * | 10/2002 | Ahn | G11B 20/1426 369/59.24 |
| 2012/0047415 | A1 * | 2/2012 | Djordjevic | H03M 13/1117 714/756 |
| 2014/0359394 | A1 * | 12/2014 | Gasanov | H03M 13/1111 714/758 |
| 2015/0236726 | A1 * | 8/2015 | Sankaranarayanan | H03M 13/1111 714/780 |
| 2016/0246674 | A1 * | 8/2016 | Chen | G11C 16/26 |
| 2018/0167133 | A1 * | 6/2018 | Choquette | H04B 7/18513 |

* cited by examiner

*Primary Examiner* — Guy J Lamarre
(74) *Attorney, Agent, or Firm* — Holzer Patel Drennan

(57) ABSTRACT

In one implementation, the disclosure provides a system including a detector configured to generate an output of a first log-likelihood ratio for each bit in an input data stream. The system also includes at least one look-up table providing a mapping of the first log-likelihood ratio to a second log-likelihood ratio. The mapping between the first log-likelihood ratio and the second log-likelihood ratio is non-linear. The system also includes a decoder configured to generate an output data stream using the second log-likelihood ratio to generate a value for each bit in the input data stream.

20 Claims, 8 Drawing Sheets

NON-LINEAR LLR LOOK-UP TABLES

PRIORITY CLAIM

The present application is a continuation application of U.S. patent application Ser. No. 16/233,555 filed on Dec. 27, 2018, and titled "Non-Linear LLR Lookup Tables" which is hereby incorporated by reference in its entirety.

BACKGROUND

Hard disc drives typically include a read-channel using a low-density parity-check (LDPC) code as the primary error correcting code and an iterative decoding algorithm that iterates by passing information in the form log-likelihood ratios (LLRs) or probability values between the channel detector and the LDPC decoder. To improve performance, the LLR values exchanged between the detector and the decoder are typically scaled by a scaling factor. However, scaling values may not provide optimal performance for every LLR value.

SUMMARY

In one implementation, the disclosure provides a system including a detector configured to generate an output of a first LLR for each bit in an input data stream. The system also includes at least one look-up table providing a mapping of the first LLR to a second LLR. The mapping between the first log-likelihood ratio and the second log-likelihood ratio is non-linear. The system also includes a decoder configured to generate an output data stream using the second log-likelihood ratio to generate a value for each bit in the input data stream.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following Detailed Description.

BRIEF DESCRIPTION OF THE DRAWINGS

FIG. 4A illustrates an example schematic of a system for time-dependent selection of LUTs between a decoder and a detector for an iterative decoding process. FIG. 4B illustrates an example schematic of a system for time-dependent selection of LUTs between a detector and a decoder for an iterative decoding process.

DETAILED DESCRIPTION

Figure 1:
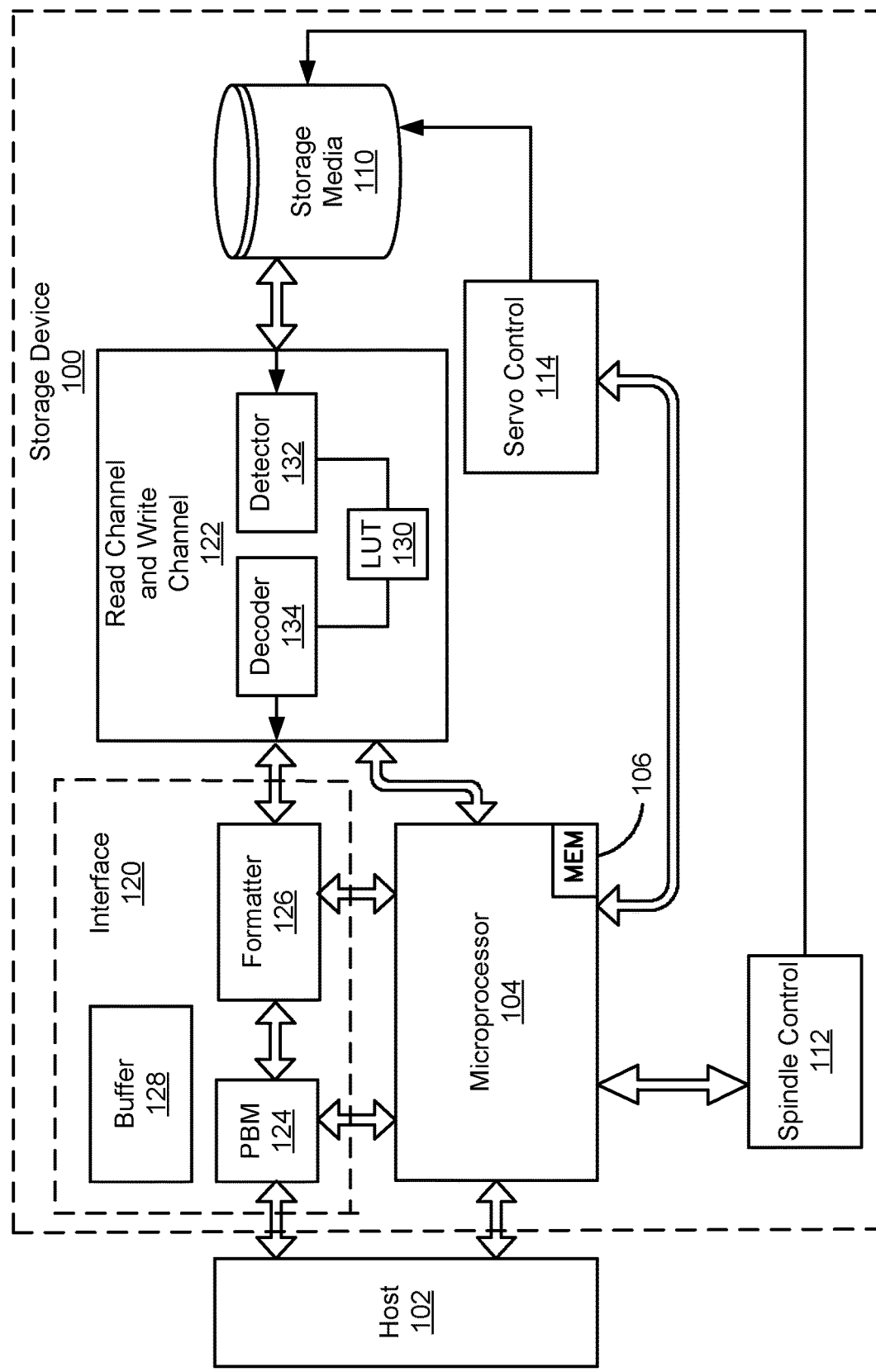
FIG. 1 illustrates an example data storage device including a LUT located between the detector and the decoder in the read and write channel.

FIG. 1 illustrates an example data storage device 100 including a LUT 130 located between the detector 132 and the decoder 134 in a read and write channel 122. Specifically, FIG. 1 shows one or more functional circuits that are resident on a disc drive printed circuit board used to control the operation of the disc drive. The storage device 100 is operably and communicatively connected to a host computer 102. Control communication paths are provided between the host computer 102 and a disc drive microprocessor 104, the microprocessor 104 generally providing top-level communication and control for the storage device 100 in conjunction with programming for the microprocessor 104 stored in microprocessor memory (MEM) 106. The MEM 106 can include random access memory (RAM), read only memory (ROM) and other sources of resident memory for the microprocessor 104. Storage device 100 stores data on a storage media 110 such as magnetic discs, optical discs, etc. The storage media 110 are rotated at a constant high speed by a spindle motor control circuit 112. A servo control circuit 114 provides control for moving an actuator that moves heads between tracks on the storage media 110 and controls the position of the head.

Communication paths are provided between the host computer 102 and the storage media 110 via an interface 120 and a number of read/write channels 122 (referred to hereinafter as read channel 122 or as write channel 122). The interface 120 includes a disc drive platform buffer manager (PBM) 124, a buffer 128 and a formatter 126 (also known as common formatter, disc formatter, etc.). Data is transferred between the host computer 102 or other device and the storage device 100 by way of the interface 120. The buffer 128 facilitates high-speed data transfer between the host computer 102 or other device and the storage device 100. Data to be written to the storage device 100 is thus passed from the host computer 102 to the interface 120 and then to the write channel 122, which encodes and serializes the data into data symbols and provides the requisite write current signals to the heads of the storage media 110.

To retrieve data that has been previously stored in the storage media 110, read signals are generated by the heads of the storage media 110 and provided to the read channel 122. In one implementation of the storage device 100, the read channel 122 performs decoding and error detection and correction operations and outputs the retrieved data to the formatter 126 for subsequent transfer to the host computer 102 or other device.

The read channel 122 performed decoding and error detection and correction operations using the detector 132 and the decoder 134. The LUT 130 provides scaling values for LLRs generated by the detector 132 for each bit in the data retrieved from the storage media 110. The scaling value and the LLR, or the scaled LLR for each bit are then passed to the decoder 134. The LLR is a ratio generated by the detector 132 indicating the likelihood that the estimated bit value generated by the detector 132 is correct. For example, in one implementation, the LLR is defined as: log(P(bit is 0|received information)/P(bit is 1|received information)). Accordingly, a very negative LLR would indicate a high probability that the corresponding bit is a 1 and a very positive LLR would indicate a high probability that the corresponding bit is a 0. An LLR of 0 would indicate that there is an equal likelihood that the bit is a 0 or a 1.

In an example implementation, the read channel 122 decodes the data received from the storage media 110 using an iterative decoding algorithm. An example of an iterative decoding algorithm used by the read channel is a low-density-parity-check (LDPC) algorithm to correct additional bit errors using successive iterative message passing between the decoder and a decoder. In some implementations, the LUT 130 changes depending on the number of successive iterations. For example, a first LUT 130 may be used for the first 10 iterations of the iterative detector, then another LUT may be used for second 10 iterations of the iterative detector. In other implementations, the LUT 130 changes based on a predetermined amount of time passing since the beginning of the iterations of the iterative decoding process as described above.

Figure 2:
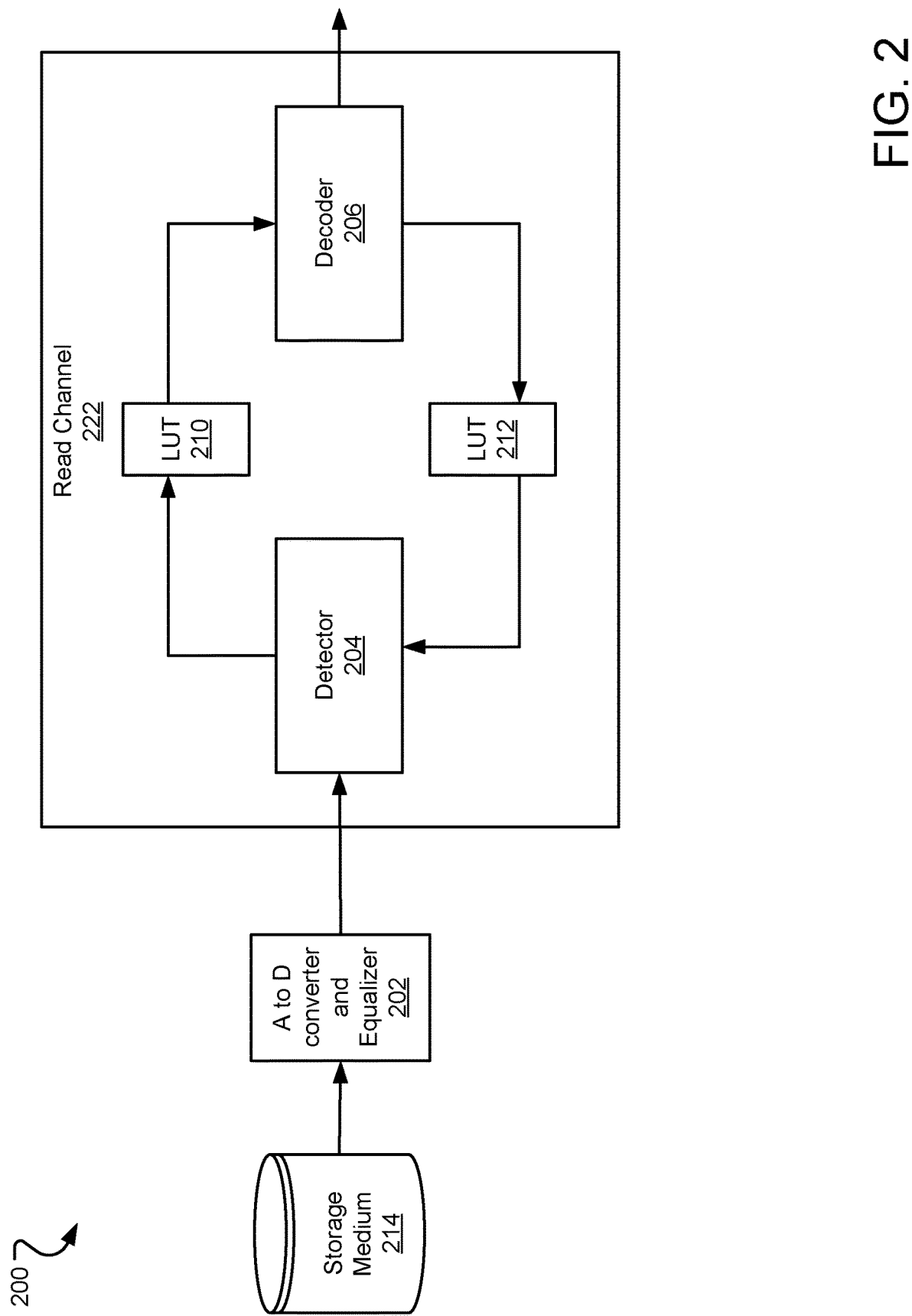
FIG. 2 illustrates an example schematic of a read channel including LUT mapping between a detector and a decoder.

FIG. 2 illustrates an example schematic of a read channel including LUT mapping between a detector 204 and a decoder 206. Data is first read from a storage medium 214. In one implementation, the storage medium 214 is a magnetic disc. Before being written to the storage medium 214, the data on the storage medium 214 is encoded. Once the data is read from the storage medium 214, it is converted from analog to digital using an analog to digital converter and equalizer 202. The digital data stream output from the analog to digital converter and equalizer 202 is then decoded by the read channel 222.

The read channel 222 includes a detector 204 and a decoder 206. The detector 204 detects the bit values in the data stream provided by the analog to digital converter and equalizer block 202. The detector 204 outputs an estimated value for each bit in the data stream, along with a LLR for each bit in the data stream. The LLR provides information about the probability that the estimate for the bit output by the detector 204 is correct. In one implementation, the LLR is defined as: log(P(bit is 0|available information)/P(bit is 1|available information)). Accordingly, a very negative LLR would indicate a high probability that the corresponding bit is a 1 and a very positive LLR would indicate a high probability that the corresponding bit is a 0. An LLR of 0 would indicate that there is an equal likelihood that the bit is a 0 or a 1.

The detector 204 communicates the estimated value for each bit along with the LLR to a decoder 206. An LUT 210 between the detector 204 and the decoder 206 scales the LLR before it is passed to the decoder 206. This scaling can emphasize or de-emphasize information from the detector 204. Additionally, scaling can reduce processing power used by the decoder 206 when decoding. The LUT 210 provides a mapping of a first LLR (the LLR provided by the detector 204) to a second LLR that is provided to the decoder 206. The mapping is non-linear and may be either symmetrical or asymmetrical depending on the recording channel characteristics.

The decoder 206 receives the second LLR obtained using the LUT 210 and the estimated value for each bit to correct the errors in the bit values. The decoder 206 is programmed with information about constraints in the code that may assist the decoder 206 in detecting errors in the bit values received from the detector 204. The decoder 206 also conducts decoder checks on the data received from the detector 204. Once the decoder checks have been met, usually through a valid code word, the decoder 206 can determine that the iterative coding process has converged and can output a data stream with correct bit values.

If, however, the decoder 206 determines that the iterative decoding process has not converged, the decoder 206 provides estimated bit values and LLRs back to the detector 204. An LUT 212 is used to provide scaling values for the LLRs provided by the decoder 206 before they are provided to the detector 204. The LUT 212 provides a mapping of the LLR provided by the decoder 206 to a scaled LLR provided to the detector 204. The mapping is non-linear and may be either symmetrical or asymmetrical. The detector 204 receives the scaled LLR values and the bit estimation and provides an updated bit estimation and LLR value for each bit in the data stream to the decoder 206. The updated LLR value is scaled by the LUT 210 before being provided to the decoder 206.

In some implementations, the LUT 210 and the LUT 212 remain constant through each iteration of the decoding process. In other implementations, the LUT 210 and the LUT 212 may be replaced during the decoding process depending on a variety of factors, such as the number of iterations of the decoding process and the amount of time that has elapsed since the beginning of the decoding process. These factors are discussed in more detail with respect to FIG. 4A and FIG. 4B. Furthermore, during on-the-fly operation, one set of LUTs may be used, and during different error recovery operations, different sets of LUTs that specifically are optimized for those error recovery schemes may be used. In addition, the choice of LUT tables for OTF and error recovery operations could change across different zones and surfaces of a disk drive depending on the channel characteristics encountered in those zones/regions/surfaces such as changing linear density or channel bit density (CBD), etc.

The LUT 210 and the LUT 212 may be selected from a subset of known LUTs to provide the best performance for the detector 204 and the decoder 206. Performance improvement is typically measured either in terms of convergence speed. For example, performance is improved when less iterations are needed on average to converge. Performance may also be measured in of failure rate of the iterative decoding process, where a lower sector failure rate is an indication of higher performance.

Figure 3:
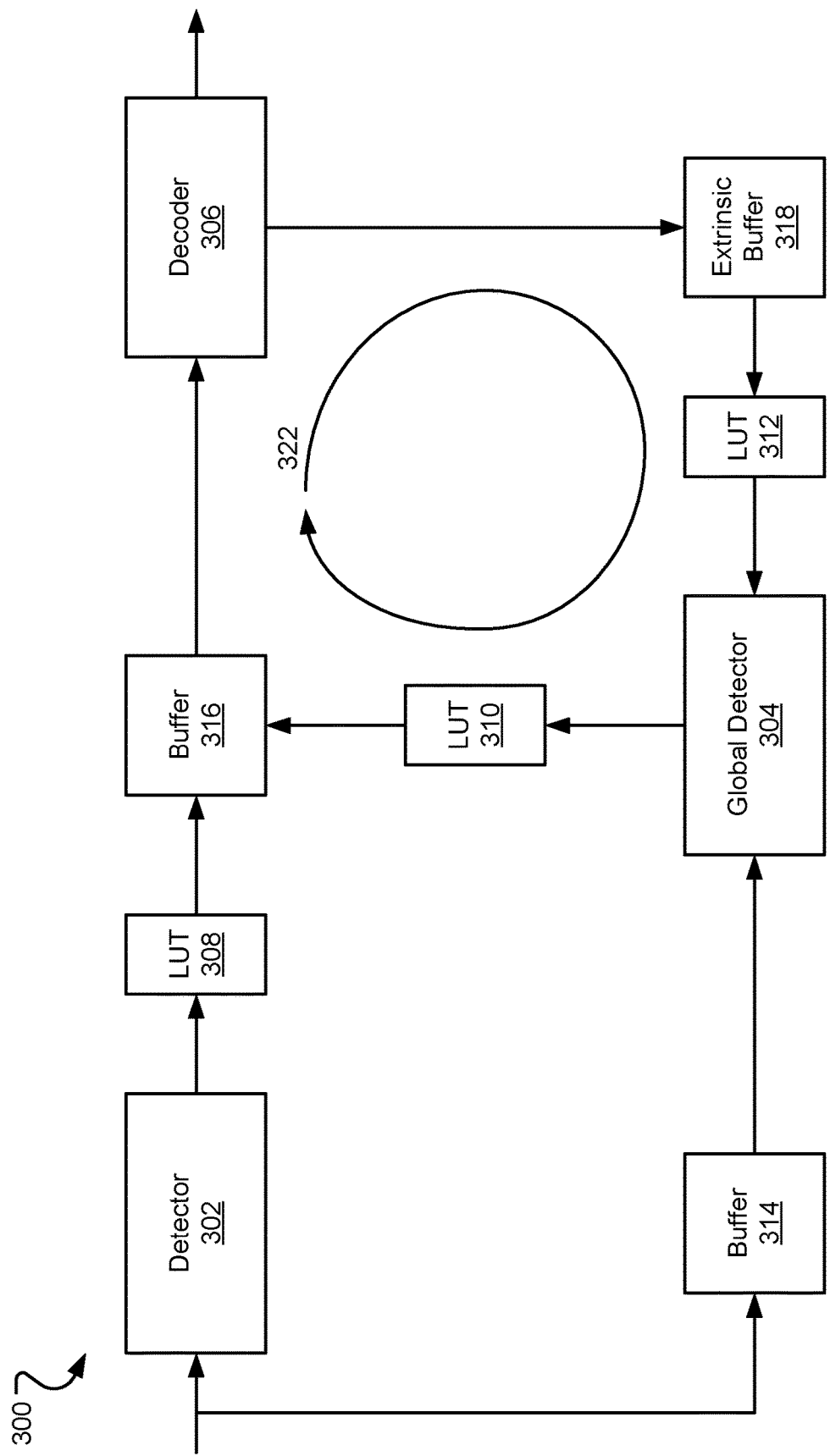
FIG. 3 illustrates an example schematic of a read and write channel including LUT mapping between detectors and decoders.

FIG. 3 illustrates an example schematic of a read channel including LUT mapping between detectors and decoders. As shown in the implementation shown in FIG. 3, multiple LUTs are used to implement an iterative decoding algorithm using a detector 302, a global detector 304, and a decoder 306. The detector 302 receives read-back samples from a storage media as a data stream. The detector 302 then generates a first LLR and an estimated value for each bit in the data stream. Before being provided to a buffer 316 to be passed to the decoder 306, the first LLR is mapped to a second LLR using a LUT 308. The LUT 308 scales the LLR. Scaling the LLR may be used to de-emphasize an LLR received from the detector 302 and may save computing resources during the decoding process.

The buffer 316 provides the second LLR and the estimated value for each data bit in the data stream to the decoder 306. The decoder is programmed with information about constraints in the code that may assist the decoder 306 in detecting errors in the bit values received from the detector 302. The decoder 306 also conducts decoder checks on the data received from the detector 302. Once the decoder checks have been met, usually through a valid code word, the decoder 306 can determine that the iterative coding process has converged and can output a data stream with corrected bit values.

If the decoder 306 determines that the iterative coding process has not converged, the decoder 306 provides an updated estimated bit value and a third LLR for each bit in the data stream to an extrinsic buffer 318. The extrinsic buffer provides the third LLR to a LUT 312. The LUT 312 provides a mapping between the third LLR and a fourth LLR that is used by the global detector 304. The global detector 304 receives the fourth LLR and the estimated bit value for each bit in the data stream from the decoder 306, along with the original data stream and provides yet another updated estimated bit value and a fifth LLR value. The fifth LLR value is provided to a LUT 310 that provides a mapping between the fifth LLR value and a sixth LLR value. The sixth LLR value and the updates estimated bit value are provided to the buffer 316, and, eventually, to the decoder 306. The decoder 306 repeats the process of determining whether the iterative coding process has converged. If the iterative coding process has converged, the decoder 306 provides the decoded data. If the iterative coding process has not converged, the process continues following an iterative loop 320 until the decoder 306 determines that the iterative coding process has converged.

In some implementations, the LUTs 308, 310, and 312 may be unique to their respective locations in the read and write channel. The LUTs 308, 310, and 312 may be related or may be unrelated. In other implementations, a single LUT may be used for the LUT 308, 310, and 312. In some implementations, the LUTs 308, 310, and 312 may be selected from a number of possible LUTs based on, for example, the number of iterations that have already passed, the amount of time that has passed since the first iteration, the step of the decoding process, or where on the storage media the read-back samples originated.

For example, when the LUTs 308, 310, and 312 are selected based on where on the storage media the read-back samples originated, a number of parameters may be used to select the LUTs 308, 310, and 312. For example, in one implementation, the selection of the LUTs 308, 310, and 312 is based on the tracks per inch (TPI) of the region of the storage media where the read-back samples originated. In another implementation, the selection of the LUTs 308, 310, and 312 is based on the bits per inch (BPI) of the region of the storage media where the read-back samples originated. In another implementation, the selection of the LUTs 308, 310, and 312 is based on the drive operation. For example, different LUTs may be selected in the drive mode is on-the-fly (OTF) operation instead of error recovery operation. Further, different error recovery operations can use different LUT selections to target different error conditions that may have occurred. For instance, if a codeword is hard to recover due to an error floor issue in the LDPC code, one set of LUTs may help, but if a codeword is hard to recover due to track squeeze or encroachment, a different set of LUTs may help. In yet another implementation, the LUTs 308, 310, and 312 are selected based on the region of the storage medium where the input data stream was stored. In yet another implementation, the LUTs 308, 310, and 312 are chosen based on the channel bit density (CBD) of the storage medium.

In some implementations, the LUTs 308, 310, and 312 may be chosen from a set of known LUTs through a training process. During the training process, known data is fed to the read-back channel for decoding. The known LUTs may be searched to find which of the known LUTs offer the best performance when used for the LUTs 308, 310, and 312. This training process may occur, for example, during initial calibration of the storage device. In some implementations, the training process may include the best known linear scalars for the given detector 302, global detector 304, and decoder 306. The training process may begin by searching for LUTs around the best known linear scalars for the detector 302, the global detector 304, and the decoder 306.

Further, in some implementations, the system may monitor performance of the LUTs 308, 310, and 312 over time and may replace the LUTs 308, 310, or 312 with substitute LUTs to increase performance of the system.

In some implementations, additional LUTs may be used. For example, an additional LUT may be located within the decoder 306. Alternatively, in some implementations, a combination of LUTs and scalars may be used. For example, the LUT 308 may be replaced with a scalar value, while the LUTs 310 and 312 are still used within the iterative loop 322.

Figure 4A:
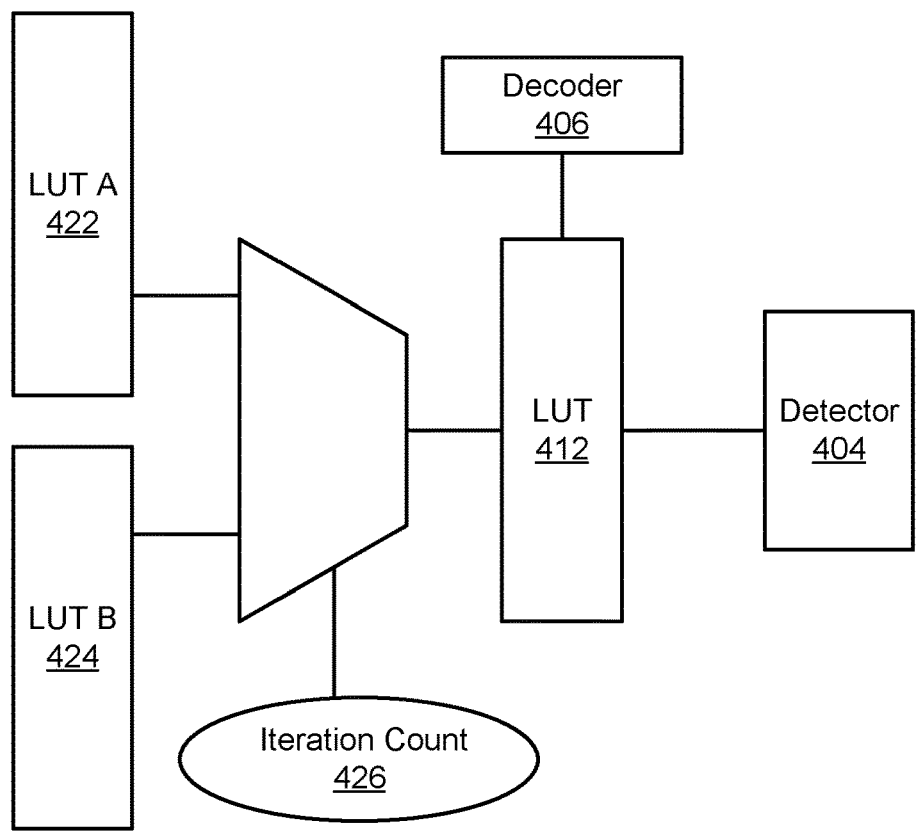
FIGS. 4A and 4B illustrate example systems for time-dependent selection of LUTs.
Figure 4B:
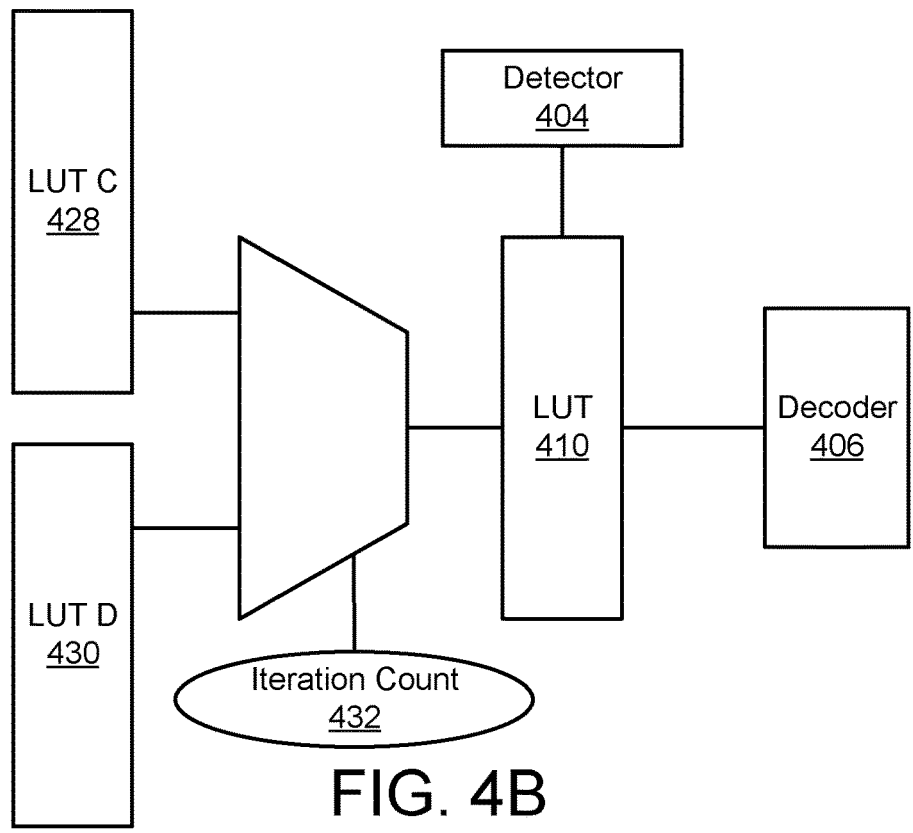

FIGS. 4A and 4B illustrate example systems for time-dependent selection of LUTs. FIG. 4A illustrates an example schematic of a system for time-dependent selection of an LUT 412 between a decoder 406 and a detector 404 for an iterative decoding process. FIG. 4B illustrates an example schematic of a system for time-dependent selection of an LUT 410 between a detector 404 and a decoder 406 for an iterative decoding process.

FIG. 4A shows one implementation for using a time-dependent selection criteria for selecting the LUT 412 to be used for LLR scaling between the decoder 404 and the detector 406. An iteration count 426 determines whether LUT A 422 or LUT B 424 will be used to provide LLR mapping between the decoder 406 and the detector 404. In the example shown in FIG. 4A, the read channel may be programmed so that LUT A is used when the iteration count 426 is at certain values and LUT B is used when the iteration count 426 is at other values. In some implementations, the LUT 412 may be chosen from a set of three or more LUTs. In other implementations, other criteria besides the iteration count 426 may be used to determine which LUT will be used to provide mapping between the decoder 406 and the detector 404. For example, the LUT 412 may be chosen based on, without limitation, a time condition, the TPI of the storage medium, the BPI of the storage medium, or other conditions that may optimize the performance of the decoder 406 and the detector 404.

FIG. 4B shows one implementation for using time-dependent selection criteria for selecting the LUT 410 to be used for LLR scaling between the detector 406 and the decoder 404. An iteration count 432 determines whether LUT C 428 or LUT D 430 will be used to provide LLR mapping between the detector 404 and the decoder 406. In the example shown in FIG. 4B, the read channel may be programmed so that LUT C is used when the iteration count 432 is at certain values and the LUT D is used when the iteration count 432 is at other values. In some implementations, the LUT 410 may be chosen from a set of three or more LUTs. In other implementations, other criteria besides the iteration count 432 may be used to determine which LUT will be used to provide mapping between the detector 404 and the decoder 406. For example, the LUT 410 may be chosen based on, without limitation, a time condition, the TPI of the storage medium, the BPI of the storage medium, or other conditions that may optimize the performance of the detector 404 and the decoder 406.

Figure 5:
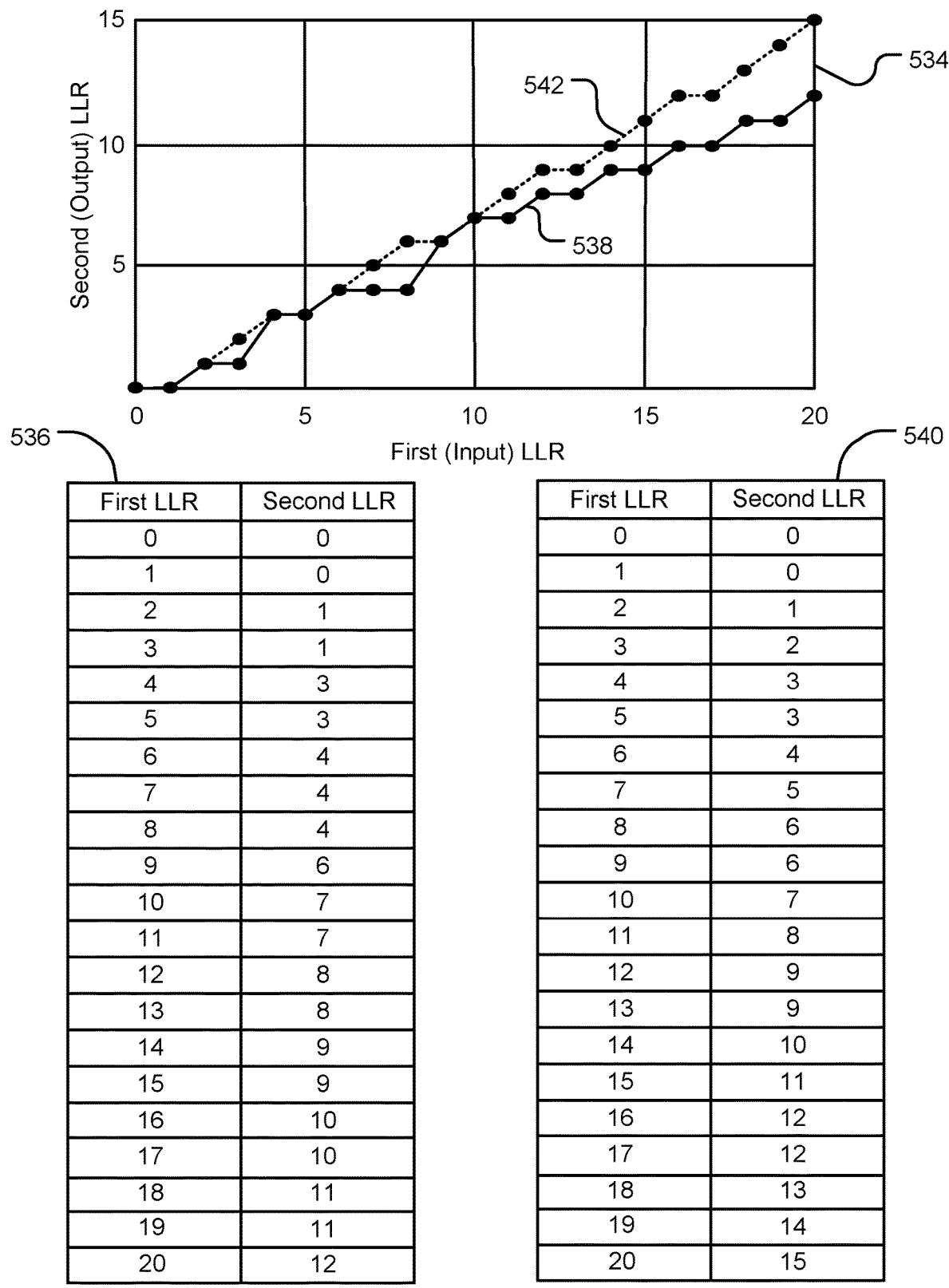
FIG. 5 illustrates an example non-linear symmetrical LUT.

FIG. 5 illustrates an example non-linear symmetrical LUT 536. The non-linear symmetrical LUT 536 may be used to provide scaling of LLRs between a detector and a decoder in a read channel of a storage device. In other implementations, the non-linear symmetrical LUT 536 may be used to provide scaling of LLRs between a detector and a decoder in other communications implementations, such as wireless communication.

As shown, the non-linear symmetrical LUT 536 corresponds to a mapping 538 of first input LLR values to second output LLR values on a graph 534. For comparison a linear symmetrical LUT 540 is also shown, corresponding to a mapping 542 of first input LLR values to second output LLR values on the graph 534. The linear symmetrical LUT 540 shows a mapping where each input LLR is scaled by 0.75 and then rounded. As a result, the linear symmetrical LUT 540 follows a predictable pattern. In contrast, there is not a pattern to the non-linear symmetrical LUT 536. Instead, each second, or output, LLR is scaled to optimize performance of the detector and decoder and the iterative decoding process. As shown by the mapping 538 of first input LLR values to second output LLR values, the non-linear symmetrical mapping 538 does have either a positive or zero slope between successive values. This slope is important so that the first input LLR values still have meaning after being scaled.

The non-linear symmetrical LUT 536 is symmetrical. Accordingly, if the first input LLR is a negative value, the second output LLR will be the same as the second output LLR for the positive first input LLR of the same absolute value, but with the opposite sign. For example, a first input LLR of 3 maps to a second output LLR of 1 using the non-linear symmetrical LUT 536. Because the non-linear symmetrical LUT 536 is symmetrical, a first input LLR of −3 maps to a second output LLR of −1.

As shown, the non-linear symmetrical LUT 536 may be used when the first LLR value is between −20 and 20. In some implementations, LLRs outside of this range may not be scaled or may be used differently. For example, a decoder may assume that an LLR of greater than 20 or less than −20 is corresponds to a bit that the detector has correctly identified. The threshold for which LLR values to include in the non-linear symmetrical LUT 536 may be determined to optimize the performance of the detector and the decoder.

Figure 6:
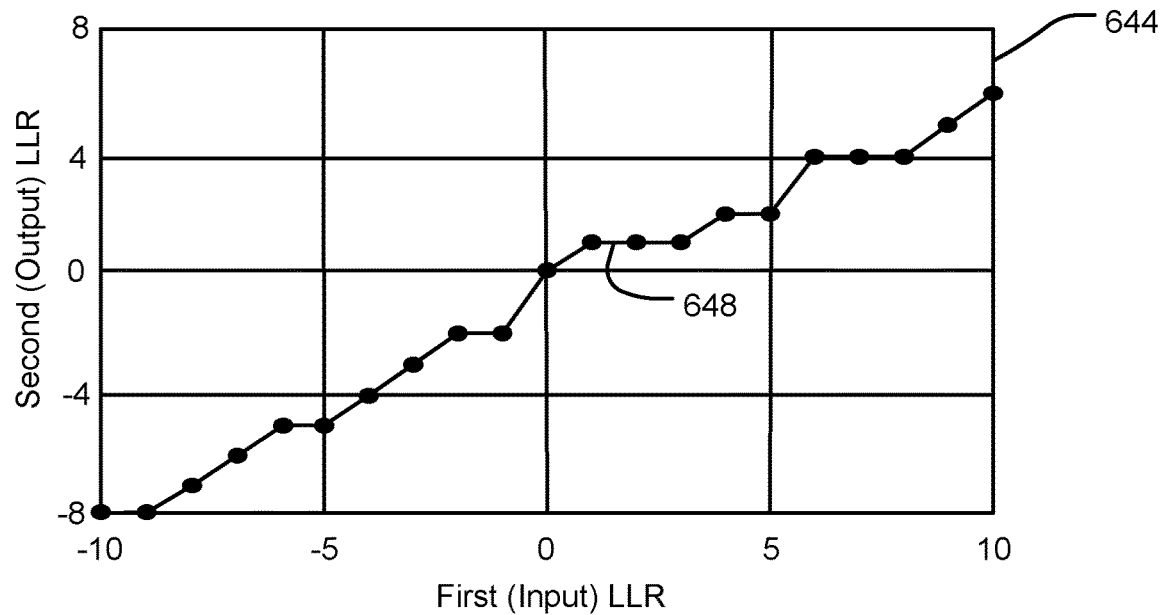
FIG. 6 illustrates an example non-linear, asymmetrical LUT.

FIG. 6 illustrates an example non-linear, asymmetrical LUT 646. The non-linear asymmetrical LUT 646 may be used to provide scaling of LLRs between a detector and a decoder in a read channel of a storage device. In other implementations, the non-linear asymmetrical LUT 646 may be used to provide scaling of LLRs between a detector and a decoder in other communications implementations, such as wireless communication.

As shown, the non-linear asymmetrical LUT 646 corresponds to a mapping 648 of first input LLR values to second output LLR values on a graph 644. There is not a pattern to the non-linear asymmetrical LUT 646. Instead, each second, or output, LLR is scaled to optimize performance of the detector and decoder and the iterative decoding process. As shown by the mapping 648 of first input LLR values to second output LLR values, the non-linear asymmetrical mapping 648 does have either a positive or zero slope between successive values. This slope is important so that the first input LLR values still have meaning after being scaled. The non-linear asymmetrical LUT 646 includes second output LLR values for first input LLR values between −10 and 10. In some implementations, LLRs outside of this range may not be scaled or may be used differently. For example, a decoder may assume that an LLR of greater than 10 or less than −10 is corresponds to a bit that the detector has correctly identified. The threshold for which LLR values to include in the non-linear asymmetrical LUT 646 may be determined to optimize the performance of the detector and the decoder.

Figure 7:
FIG. 7 illustrates example operations for using a non-linear LUT.

FIG. 7 illustrates example operations 700 for using a non-linear LUT. A generating operation 702 generates a first LLR for each bit in an input data stream. The generating operation 702 may be completed by a detector receiving an input data stream from a storage medium. In some implementations, the data stream may be read from the storage medium and then passed through an analog to digital converter before being passed to the detector. The detector uses the input data stream to generate an estimated bit value for each bit in the data stream, along with an LLR corresponding to the estimated bit value. The LLR provides information about the probability that the estimate for the bit output by the detector is correct. In one implementation, the LLR is defined as: log(P(bit is 0|available information)/P(bit is 1|available information)). Accordingly, a very negative LLR would indicate a high probability that the corresponding bit is a 1 and a very positive LLR would indicate a high probability that the corresponding bit is a 0. An LLR of 0 would indicate that there is an equal likelihood that the bit is a 0 or a 1.

A mapping operation 704 maps the first LLR to a second LLR using at least one LUT. The mapping between the first LLR and the second LLR is non-linear. The mapping of the first LLR to the second LLR effectively scales the first LLR before it is passed to the decoder. Rather than using a fixed scalar for every LLR value, the LUT provides a value for each first LLR. The LUT is non-linear, so the mapping for each first LLR value can be chosen to optimize performance of the decoding operation by the detector and the decoder. The mapping may be symmetrical or asymmetrical.

A generating operation 706 generates an output data stream using the second log-likelihood ratio to generate a value for each bit in the input data stream. The decoder receives the second mapped LLR value and the bit value estimate for each bit in the input data stream. Because the decoder is programmed with information about constraints in the code, the decoder may detect errors in the estimated bit values generated by the detector. In some implementations, the decoding process is iterative, so the decoder conducts decoder checks to determine whether the iterative coding process has converged. Once the decoder checks have been met, usually through a valid code word, the decoder can determine that the iterative coding process has converged and can output a data stream with correct bit values.

If, however, the decoder determines that the iterative coding process has not converged, the decoder provides estimated bit values and LLRs back to the detector. An LUT may be used to provide scaling values for the LLRs provided by the decoder before they are provided to the detector. The LUT provides a mapping of the LLR provided by the decoder to a scaled LLR provided to the detector. The mapping is non-linear and may be either symmetrical or asymmetrical. The detector receives the scaled LLR values and the bit estimation and provides an updated bit estimation and LLR value for each bit in the data stream to the decoder. The updated LLR value is scaled by the LUT before being provided to the decoder.

Figure 8:
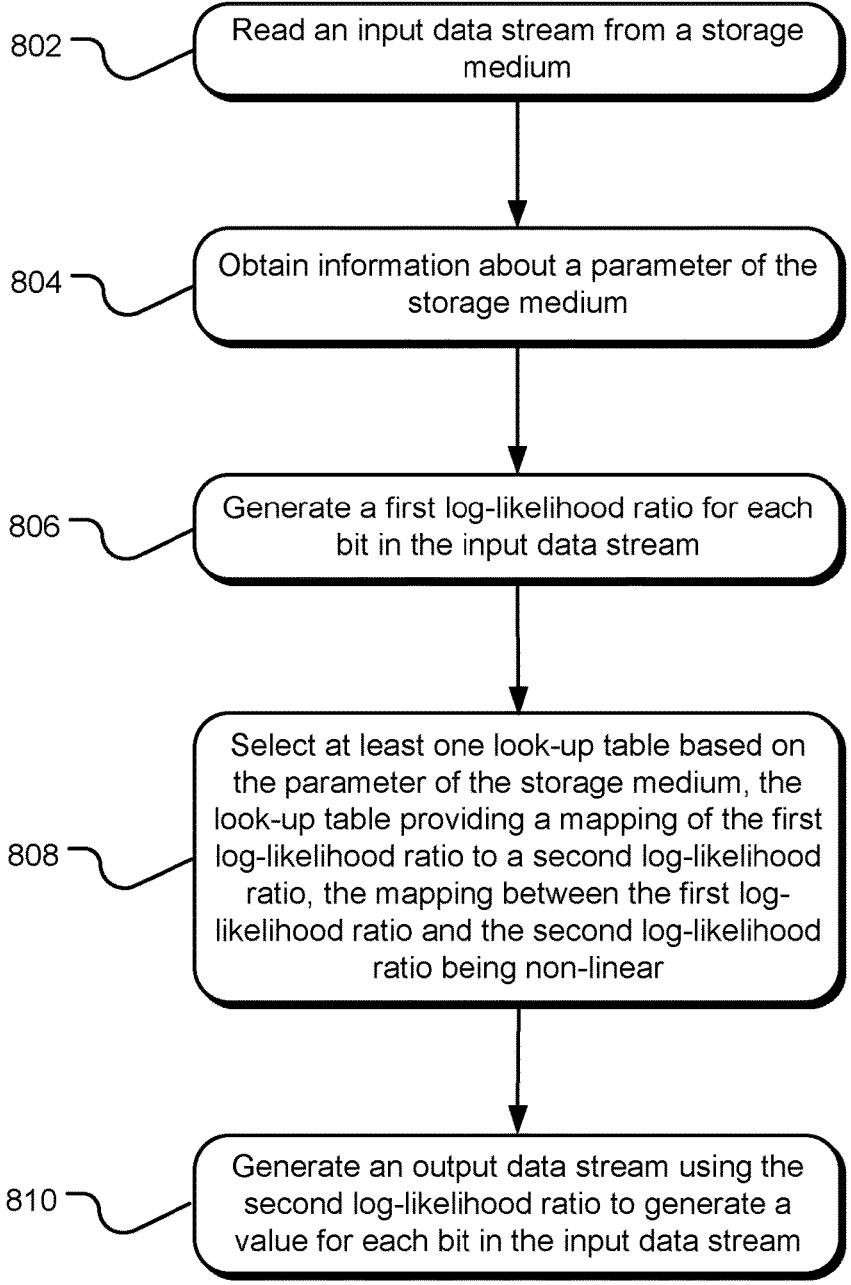
FIG. 8 illustrates alternative example operations for using a non-linear LUT.

FIG. 8 illustrates example operations 800 for selecting and using a non-linear LUT. A reading operation 802 reads an input data stream from a storage medium. The data stream is read from the storage medium and may then be passed through an analog to digital converter before being passed to the detector.

An obtaining operation 804 obtains information about a parameter of the storage medium. The parameter of the storage medium may be, for example, BPI, TPI, drive operation of the storage drive, or the region of the storage medium where the input data stream was originally stored.

A first generating operation 806 generates a first LLR for each bit in the input data stream. The detector uses the input data stream to generate an estimated bit value for each bit in the data stream, along with an LLR corresponding to the estimated bit value. The LLR provides information about the probability that the estimate for the bit output by the detector is correct. In one implementation, the LLR is defined as: log(P(bit is 0|available information)/P(bit is 1|available information)). Accordingly, a very negative LLR would indicate a high probability that the corresponding bit is a 1 and a very positive LLR would indicate a high probability that the corresponding bit is a 0. An LLR of 0 would indicate that there is an equal likelihood that the bit is a 0 or a 1.

A selecting operation 808 selects at least one LUT based on the parameter of the storage medium. The LUT provides a mapping of the first LLR to a second LLR. The mapping between the first LLR and the second LLR is non-linear. Rather than using a fixed scalar for every LLR value, the LUT provides a value for each first LLR. The LUT is non-linear, so the mapping for each first LLR value can be chosen to optimize performance of the decoding operation by the detector and the decoder. The mapping may be symmetrical or asymmetrical. The LUT is selected to provide an optimum performance for the decoding process.

A second generating operation 810 generates an output data stream using the second log-likelihood ratio to generate a value for each bit in the input data stream. The decoder receives the second mapped LLR value and the bit value estimate for each bit in the input data stream. Because the decoder is programmed with information about constraints in the code, the decoder may detect errors in the estimated bit values generated by the detector. In some implementations, the decoding process is iterative, so the decoder conducts decoder checks to determine whether the iterative coding process has converged. Once the decoder checks have been met, usually through a valid code word, the decoder can determine that the iterative coding process has converged and can output a data stream with correct bit values.

If, however, the decoder determines that the iterative coding process has not converged, the decoder provides estimated bit values and LLRs back to the detector. An LUT may be used to provide scaling values for the LLRs provided by the decoder before they are provided to the detector. The LUT provides a mapping of the LLR provided by the decoder to a scaled LLR provided to the detector. The mapping is non-linear and may be either symmetrical or asymmetrical. The detector receives the scaled LLR values and the bit estimation and provides an updated bit estimation and LLR value for each bit in the data stream to the decoder. The updated LLR value is scaled by the LUT before being provided to the decoder.

The embodiments of the disclosed technology described herein are implemented as logical steps in one or more computer systems. The logical operations of the presently disclosed technology are implemented (1) as a sequence of processor-implemented steps executing in one or more computer systems and (2) as interconnected machine or circuit modules within one or more computer systems. The implementation is a matter of choice, dependent on the performance requirements of the computer system implementing the disclosed technology. Accordingly, the logical operations making up the embodiments of the disclosed technology described herein are referred to variously as operations, steps, objects, or modules. Furthermore, it should be understood that logical operations may be performed in any order, adding and omitting as desired, unless explicitly claimed otherwise or a specific order is inherently necessitated by the claim language.

The above specification, examples, and data provide a complete description of the structure and use of exemplary embodiments of the disclosed technology. Since many embodiments of the disclosed technology can be made without departing from the spirit and scope of the disclosed technology, the disclosed technology resides in the claims hereinafter appended. Furthermore, structural features of the different embodiments may be combined in yet another embodiment without departing from the recited claims.

What is claimed is:

1. A system comprising:
    a detector configured to generate an output of a first log-likelihood ratio for each bit in an input data stream read from a storage medium;
    a first look-up table providing a mapping of the first log-likelihood ratio to a second log-likelihood ratio, the mapping between the first log-likelihood ratio and the second log-likelihood ratio being non-linear, the first look-up table being selected based on a density parameter of the storage medium; and
    a decoder configured to generate an output data stream using the second log-likelihood ratio to generate a value for each bit in the input data stream.

2. The system of claim 1, wherein the density parameter of the storage medium is tracks per inch.

3. The system of claim 1, wherein the density parameter of the storage medium is bits per inch.

4. The system of claim 1, wherein the density parameter of the storage medium is channel bit density.

5. The system of claim 1, wherein the density parameter of the storage medium is related to a region of the storage medium including the input data stream.

6. The system of claim 1, wherein the first look-up table being selected based on whether the drive operation is on-the-fly or error recovery.

7. The system of claim 6, wherein the first look-up table is further selected based on the type of error condition when the drive operation is error recovery.

8. A method comprising:
    generating a first log-likelihood ratio for each bit in an input data stream read from a storage medium;
    selecting at least one look-up table based on a density parameter of the storage medium;
    mapping the first log-likelihood ratio to a second log-likelihood ratio using at least one look-up table, the mapping between the first log-likelihood ratio and the second-log likelihood ratio being non-linear; and
    generating an output data stream using the second log-likelihood ratio to generate a value for each bit in the input data stream.

9. The method of claim 8, wherein the density parameter of the storage medium is tracks per inch.

10. The method of claim 8, wherein the density parameter of the storage medium is bits per inch.

11. The method of claim 8, wherein the density parameter of the storage medium is channel bit density.

12. The method of claim 8, wherein the density parameter of the storage medium is related to a region of the storage medium including the input data stream.

13. The method of claim 8, wherein the first look-up table being selected based on whether the drive operation is on-the-fly or error recovery.

14. The method of claim 13, wherein the first look-up table is further selected based on the type of error condition when the drive operation is error recovery.

15. A method comprising:
    reading an input data stream from a storage medium;

obtaining information about a density parameter of the storage medium;

generating a first log-likelihood ratio for each bit in the input data stream;

selecting at least one look-up table based on the parameter of the storage medium, the look-up table providing a mapping of the first log-likelihood ratio to a second log-likelihood ratio, the mapping between the first log-likelihood ratio and the second log-likelihood ratio being non-linear; and generating an output data stream using the second log-likelihood ratio to generate a value for each bit in the input data stream.

16. The method of claim 15, wherein the density parameter of the storage medium is tracks per inch.

17. The method of claim 15, wherein the density parameter of the storage medium is bits per inch.

18. The method of claim 15, wherein the density parameter of the storage medium is channel bit density.

19. The method of claim 15, wherein the density parameter of the storage medium is related to a region of the storage medium including the input data stream.

20. The method of claim 15, wherein the first look-up table being selected based on whether the drive operation is on-the-fly or error recovery.

* * * * *